(12) United States Patent
Kim et al.

(10) Patent No.: US 9,870,730 B2
(45) Date of Patent: Jan. 16, 2018

(54) GATE CIRCUIT, DRIVING METHOD FOR GATE CIRCUIT AND DISPLAY DEVICE USING THE SAME

(71) Applicant: Samsung Display Co., Ltd., Yongin-si, Gyeonggi-do (KR)

(72) Inventors: Jong Hee Kim, Yongin-si (KR); Ji-Sun Kim, Seoul (KR); Jun Hyun Park, Suwon-si (KR); Young Wan Seo, Suwon-si (KR); Jae Keun Lim, Suwon-si (KR); Chong Chul Chai, Seoul (KR)

(73) Assignee: Samsung Display Co., Ltd. (KR)

( * ) Notice: Subject to any disclaimer, the term of this patent is extended or adjusted under 35 U.S.C. 154(b) by 106 days.

(21) Appl. No.: 14/920,596

(22) Filed: Oct. 22, 2015

(65) Prior Publication Data

US 2016/0240129 A1 Aug. 18, 2016

(30) Foreign Application Priority Data

Feb. 13, 2015 (KR) ........................ 10-2015-0022597

(51) Int. Cl.
*G09G 3/36* (2006.01)
*G09G 3/20* (2006.01)
*H03K 19/0175* (2006.01)

(52) U.S. Cl.
CPC ... *G09G 3/2092* (2013.01); *H03K 19/017509* (2013.01); *G09G 2310/0286* (2013.01)

(58) Field of Classification Search
CPC .......... G09G 3/22; G09G 3/3208; G09G 3/30; G09G 3/3225; G09G 3/3233; G09G 3/3241; G09G 3/3266; G09G 3/3275; G09G 3/3258
See application file for complete search history.

(56) References Cited

U.S. PATENT DOCUMENTS

| 8,159,446 B2* | 4/2012 | Lee ....................... G09G 3/3677 |
| | | 345/100 |
| 9,123,310 B2* | 9/2015 | Choi .................... G09G 3/3696 |
| 9,406,272 B2* | 8/2016 | Lee ....................... G09G 3/3677 |
| 2007/0052658 A1* | 3/2007 | Kim ...................... G09G 3/3648 |
| | | 345/100 |

(Continued)

FOREIGN PATENT DOCUMENTS

| CN | 103714789 | 4/2014 |
| EP | 2713361 | 4/2014 |

(Continued)

*Primary Examiner* — Kent Chang
*Assistant Examiner* — William Lu
(74) *Attorney, Agent, or Firm* — Innovation Counsel LLP

(57) ABSTRACT

A gate circuit according to an exemplary embodiment of the present inventive concept comprises a plurality of stages, each receiving a clock signal and outputting a gate signal and a carry signal. One of the plurality of stages includes a first transistor of which a first terminal and a control terminal are connected to each other and a carry signal of a stage before previous stage is input to the first terminal and the control terminal and a second transistor of which a gate signal of the previous stage is input to a first terminal, a control terminal is connected with a second terminal of the first transistor, and an output terminal is connected to a first node.

15 Claims, 6 Drawing Sheets

(56) References Cited

U.S. PATENT DOCUMENTS

| | | | |
|---|---|---|---|
| 2008/0036725 A1* | 2/2008 | Lee | G09G 3/3677 345/100 |
| 2009/0040203 A1* | 2/2009 | Kim | G09G 3/3677 345/204 |
| 2010/0085348 A1* | 4/2010 | Bae | G09G 3/3648 345/213 |
| 2010/0309184 A1* | 12/2010 | Yamamoto | G09G 3/3677 345/209 |
| 2011/0069044 A1* | 3/2011 | Lee | G11C 19/28 345/204 |
| 2014/0092078 A1 | 4/2014 | Yoon et al. | |
| 2015/0042383 A1 | 2/2015 | Kwon et al. | |
| 2015/0042547 A1 | 2/2015 | Kwon et al. | |
| 2015/0042638 A1 | 2/2015 | Kwon et al. | |
| 2015/0042689 A1 | 2/2015 | Kim et al. | |
| 2015/0077407 A1 | 3/2015 | Kim et al. | |

FOREIGN PATENT DOCUMENTS

| | | |
|---|---|---|
| JP | 2014-071452 | 4/2014 |
| KR | 10-2009-0081850 | 7/2009 |
| KR | 10-2010-0094613 | 8/2010 |
| KR | 10-2012-0008761 | 2/2012 |
| KR | 10-2015-0017810 | 2/2015 |
| KR | 10-2015-0018969 | 2/2015 |
| KR | 10-2015-0018970 | 2/2015 |
| KR | 10-2015-0019098 | 2/2015 |
| KR | 10-2015-0031899 | 3/2015 |

\* cited by examiner

GATE CIRCUIT, DRIVING METHOD FOR GATE CIRCUIT AND DISPLAY DEVICE USING THE SAME

CROSS-REFERENCE TO RELATED APPLICATION

This application claims priority to and the benefit of Korean Patent Application No. 10-2015-0022597 filed in the Korean Intellectual Property Office on Feb. 13, 2015, the entire contents of which are incorporated herein by reference.

BACKGROUND (a) Field

The present inventive concept relates to a gate driver, a method for driving the gate driver, and a display device using the same. More particularly, the present inventive concept relates to a display device including a gate driver integrated into the display device.

(b) Description of the Related Art

In general, a liquid crystal display, which is one of the most common types of flat panel displays currently in use, includes two display panels where field generating electrodes, such as a pixel electrode and a common electrode, are formed and a liquid crystal layer interposed therebetween. The liquid crystal display generates an electric field in the liquid crystal layer by applying a voltage to the field generating electrodes, determines a direction of liquid crystal molecules of the liquid crystal layer, and displays an image by controlling polarization of incident light. The display device includes an organic light emitting device, a plasma display device, an electrophoretic display, and the like, in addition to the liquid crystal display.

Such a display device includes a gate driver and a data driver. The gate driver may be patterned together with a gate line, a data line, and a thin film transistor, and thus may be integrated on the display device. As such, since the integrated gate driver is not required to form a separate gate driving chip, there is an advantage in that manufacturing costs are reduced.

However, as the display device increases in size and resolution of the display device becomes higher, a leakage current of a node Q, which controls an output of a gate signal or a carry signal, flowing through a control transistor disposed between a input and the node Q is increased in proportion to the increased size of the control transistor during a bootstrapping time. This causes a problem in circuit reliability (particularly in gate falling time increasing due to voltage drop in node Q and in carry signal weakening).

The above information disclosed in this Background section is only to enhance the understanding of the background of the inventive concept, and therefore it may contain information that does not form the prior art.

SUMMARY

The present inventive concept has been made in an effort to overcome the above problems by providing a gate driver, a driving method of the gate circuit, and a display device using the gate driver to enhance stability by increasing a pre-charging margin of a node Q and increasing a bootstrap voltage.

In addition, reduction of a gate circuit size is effective in narrowing a bezel and in improving reliability.

The technical object of the present inventive concept is not limited to the above, and other technical objects not described above will be apparent to those skilled in the art from the disclosure of the present inventive concept.

A gate circuit according to an exemplary embodiment of the present inventive concept comprises a plurality of stages, each receiving a clock signal and outputting a gate signal and a carry signal. One of the plurality of stages includes a first transistor, of which a first terminal and a control terminal are connected to each other and a carry signal of a stage before a previous stage is input to the first terminal and the control terminal, and a second transistor, of which a gate signal of the previous stage is input to a first terminal, a control terminal is connected with a second terminal of the first transistor, and an output terminal is connected to a first node, the carry signal of the stage before the previous stage is applied to the control terminal of the second transistor through the first transistor, the gate signal of the previous stage is input to the first terminal of the second transistor, a voltage difference between the control terminal and an output terminal of the second transistor is boosted during an enable time of the gate signal of the previous stage, and a voltage of the first node is boosted at a rising time of the clock signal.

The gate driver according to the exemplary embodiment of the present inventive concept further includes: a third transistor, a control terminal of which is connected to the first node and an input terminal of which is connected to the clock signal; and a capacitor connected to the first node and an output terminal of the third transistor, wherein the capacitor is pre-charged corresponding to the gate signal of the previous stage during the enable time of the gate signal of the previous stage and boosted during the rising time of the clock signal.

The gate driver according to the exemplary embodiment of the present inventive concept further includes a fourth transistor including a first terminal to which the clock signal is applied and a control terminal connected to the first node, wherein the carry signal corresponding to the clock signal applied to the fourth transistor is generated.

The gate driver according to the exemplary embodiment of the present inventive concept further includes a fifth transistor including a first terminal connected to the control terminal of the second transistor, a control terminal to which the carry signal is input, and a second terminal to which a low voltage is applied, wherein the fifth transistor applies the low voltage to the control terminal of the second transistor according to the carry signal.

According to another exemplary embodiment of the present inventive concept, a method for driving a gate driver includes a plurality of stages, each receiving a clock signal and outputting a gate signal and a carry signal, one of the plurality of stages including a first transistor of which a first terminal and a control terminal are connected to each other and a carry signal of a stage before a previous stage is input to the first terminal and the control terminal, and a second transistor of which a gate signal of the previous stage is input to a first terminal, a control terminal is connected with a second terminal of the first transistor, and an output terminal is connected to a first node. The method includes: applying a carry signal of the stage before the previous stage to the control terminal of the second transistor through the first transistor; inputting the gate signal of the previous stage to the first terminal of the second transistor; boosting the voltage difference between the control terminal and the output terminal of the second transistor during an enable time of the gate signal of the previous stage; and boosting a voltage of the first node during a rising time of the clock signal.

According to the other exemplary embodiment of the present inventive concept, the method further comprises a third transistor including a control terminal connected to the first node and an input terminal connected to the clock signal, and a capacitor connected to the control terminal and an output terminal of the third transistor, wherein the capacitor is pre-charged corresponding to the gate signal of the previous stage during the enable time of the gate signal of the previous stage, and the capacitor is boosted during the rising time of the clock signal.

The method according to the other exemplary embodiment of the present inventive concept further includes a fourth transistor including a first terminal to which the clock signal is applied and a control terminal connected to the first node, wherein the carry signal corresponding to the clock signal applied to the fourth transistor is generated.

The method according to the other exemplary embodiment of the present inventive concept further includes a fifth transistor including a first terminal connected to the control terminal of the second transistor, a control terminal to which the carry signal is input, and a second terminal to which a low voltage is applied, wherein the fifth transistor applies the low voltage to the control terminal of the second transistor according to the carry signal.

A display device according to another exemplary embodiment of the present inventive concept includes a display unit including a plurality of pixels connected to corresponding gate lines and a gate driver including a plurality of stages, each receiving a clock signal and outputting a gate signal to the gate line, wherein one of the plurality of stages includes: a first transistor of which a first terminal and a control terminal are connected and a carry signal of a stage before a previous stage is input to the first terminal and the control terminal; and a second transistor, of which a gate signal of the previous stage is input to a first terminal, a control terminal is connected with a second terminal of the first transistor, and an output terminal is connected with a first node, the carry signal of the stage before the previous stage is applied to the control terminal of the second transistor through the first transistor, the gate signal of the previous stage is input to the first terminal of the second transistor, a voltage difference between the control terminal and the output terminal of the second transistor is boosted during an enable time of the gate signal of the previous stage, and a voltage of the first node is boosted during a rising time of the clock signal.

The display device according to the other exemplary embodiment of the present inventive concept further includes a third transistor, including a control terminal connected to the first node and an input terminal to which a clock signal is applied, and a capacitor connected to the first node and an output terminal of the third transistor, wherein the capacitor is pre-charged corresponding to the gate signal of the previous stage during the enable time of the gate signal of the previous stage and boosted during the rising time of the clock signal.

The display device according to the other exemplary embodiment of the present inventive concept further includes a fourth transistor including a first terminal to which the clock signal is applied and a control terminal connected to the first node, wherein the carry signal corresponding to the clock signal applied the fourth transistor is generated.

The display device according to the other exemplary embodiment of the present inventive concept further includes a fifth transistor including a first terminal connected to the control terminal of the second transistor, a control terminal to which the carry signal is input, and a second terminal to which a low voltage is applied, wherein the fifth transistor applies the low voltage to the control terminal of the second transistor according to the carry signal.

The gate driver, the driving method of the gate circuit, and the display device according to the exemplary embodiments can enhance stability by increasing a pre-charging margin of a node Q and increasing a bootstrap voltage.

In addition, reduction of a gate circuit size is effective in narrowing a bezel and in improving reliability.

DETAILED DESCRIPTION OF THE EMBODIMENTS

Figure 1:
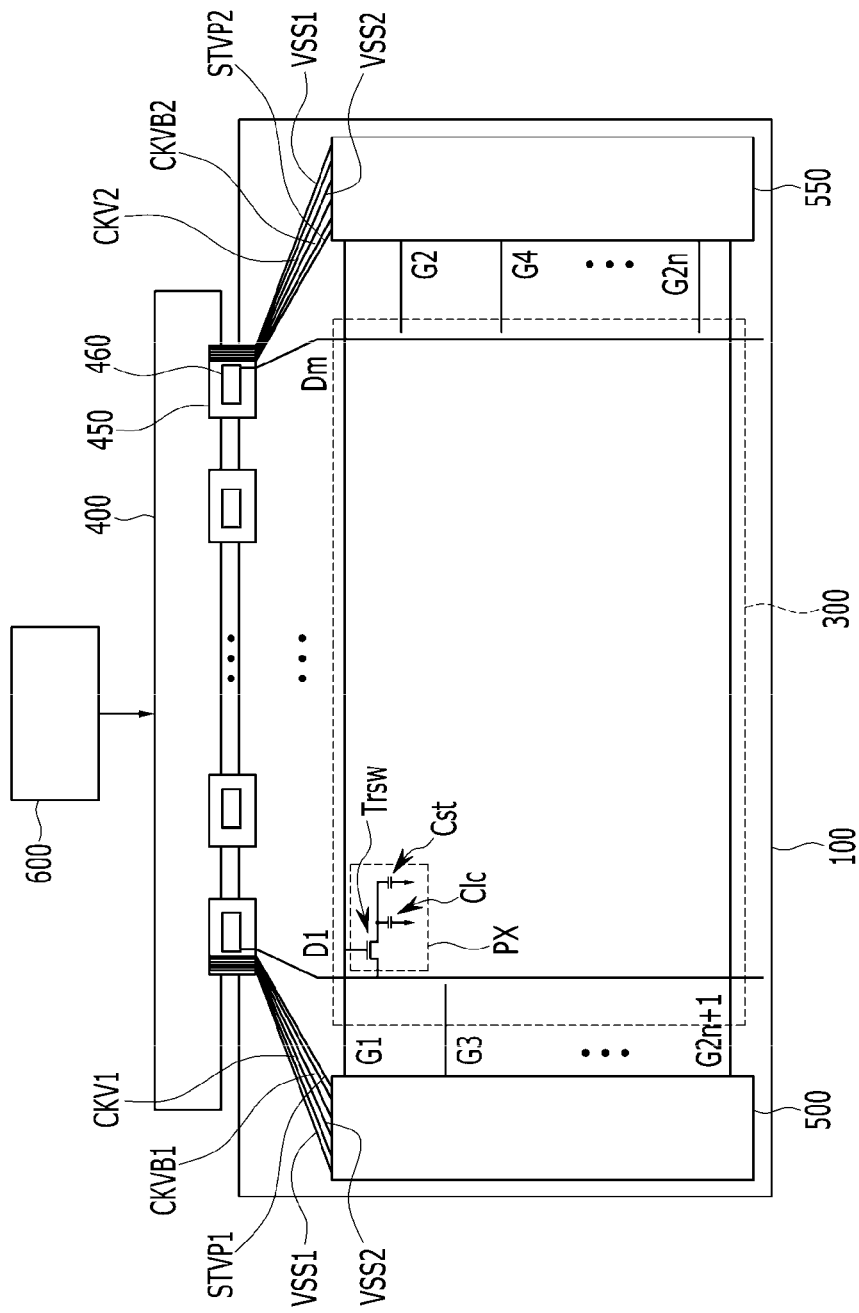
FIG. 1 is a block diagram of a display device according to an exemplary embodiment.

Hereinafter, preferable exemplary embodiments of the present inventive concept will be described in more detail with reference to the accompanying drawings. Like reference numerals refer to like elements throughout the specification and a duplicated description of like elements will be omitted. The use of "module" and "unit" as suffixes for components in the specification are provided only for ease of description of the specification and they do not have their own separate meanings or roles in and of themselves. Further, in describing the present inventive concept, when it is determined that the detailed description of the publicly known art related to the present inventive concept may obscure the gist of the present inventive concept, the detailed description thereof will be omitted. In addition, the accompanying drawings are only for ease of understanding the exemplary embodiment disclosed in the specification, and the technical spirit disclosed in the specification is not limited thereto, and it should be appreciated that the accompanying drawings include all changes, equivalents, or substitutions included in the spirit and the technical scope of the present inventive concept.

Terms including an ordinal number such as first or second may be used to describe various components, but the components are not limited by the terms. The terms are used only to distinguish one component from the other component.

It should be understood that, when an element is described as "coupled" or "connected" to another element, the element may be "directly coupled" or "directly connected" to the other element or "coupled" or "connected" to the other element through a third element. In contrast, it should be understood that, when an element is described as "directly coupled" or "directly connected" to another element, it is understood that no element is present between the element and the other element.

A singular form may include a plural form if there is no clearly opposite meaning in the context.

In the present application, it should be understood that term "include" indicates that a feature, a number, a step, an operation, a component, a part or the combination thereof described in the specification is present, but does not exclude a possibility of the presence or addition of one or more other features, numbers, steps, operations, components, parts or combinations.

In the drawings, the thickness of layers, films, panels, regions, etc., are exaggerated for clarity. Like reference numerals designate like elements throughout the specification. It will be understood that when an element, such as, a layer, film, region, or substrate, is referred to as being "on" another element, the element may be directly on the other element or intervening elements may also be present. In contrast, when an element is referred to as being "directly on" another element, there are no intervening elements present.

FIG. 1 is a block diagram of a display device according to an exemplary embodiment of the present inventive concept.

Hereinafter, referring to FIG. 1, a display device according to an exemplary embodiment of the present inventive concept will be described.

Referring to FIG. 1, a display device 100 according to an exemplary embodiment of the present inventive concept includes a display area 300 where an image is displayed and first and second gate drivers 500 and 550 supplying gate signals to gate lines G1 to G2$n$+1 of the display area 300.

A data driver IC 460 supplying a data voltage to data lines D1 to Dm of the display area 300 may be formed on a film such as a flexible printed circuit film (FPC) 450.

The data driver IC 460, the first gate driver 500, and the second gate driver 550 are controlled by a signal controller 600. The flexible printed circuit film 450 is electrically connected to a printed circuit board (PCB) 400, and a signal from the signal controller 600 may be transmitted to the data driver IC 460, the first gate driver 500, and the second gate driver 550 through the printed circuit board (PCB) 400 and the flexible printed circuit film 450.

The signal supplied from the signal controller 600 includes a first clock signal [CKV1], a second clock signal [CKVB1], a third clock signal [CKV2], a fourth clock signal [CKVB2], scan start signals [STVP1, STVP2], and signals supplying a predetermined level of low voltages VSS1 and VSS2.

The display area 300 includes a plurality of pixels PXs. When the display device 100 is a liquid crystal display, each pixel PX includes a thin film transistor Trsw, a liquid crystal capacitor Clc, and a storage capacitor Cst. A control terminal of the thin film transistor Trsw is connected to one gate line, an input terminal of the thin film transistor Trsw is connected to one data line, and an output terminal of the thin film transistor Trsw is connected to a first terminal of the liquid crystal capacitor Clc and a first terminal of the storage capacitor Cst.

A second terminal of the liquid crystal capacitor Clc is connected to a common electrode and a second terminal of the storage capacitor Cst receives a storage voltage Vcst applied from the signal controller 600. The structure of the pixel PX of the liquid crystal display may be realized with various exemplary embodiments, and in FIG. 1, a pixel PX having a configuration beyond a basic structure of the pixel PX may also be applied to the present inventive concept.

In FIG. 1, the display device 100 is implemented as a liquid crystal display as an example, but when the display device 100 is implemented as an organic light emitting display device, the pixel PX includes a thin film transistor and an organic light emitting diode, and another display device forms a display area 300 including an element such as a thin film transistor. The present inventive concept is not limited to a liquid crystal display, but the liquid crystal display will be exemplarily described for a clear description.

The display area 300 includes a plurality of gate lines G1 to G2$n$+1 and a plurality of data lines D1 to Dm, and the plurality of gate lines G1 to G2$n$+1 and the plurality of data lines D1 to Dm cross each other in an insulated manner.

The data driver IC 460 is provided in an upper or lower side of the display device 100 and connected to the vertically extended data lines D1 to Dm, and in the exemplary embodiment of FIG. 1, the data driver IC 460 is provided in the upper side of the display device 100.

The first gate driver 500 and the second gate driver 550 may be respectively provided on the left side and the right side of the display device 100.

When the first clock signal [CKV1], the second clock signal [CKVB1], the scan start signal STVP1, and the first low voltage VSS1 are applied, the first gate driver 500 generates gate signals (i.e., a gate on signal and a gate off signal) to sequentially apply the gate signal to odd-numbered gate lines G1, G3, . . . , and G2$n$+1.

When the third clock signal [CKV2], the fourth clock signal [CKVB2], the scan start signal STVP2, and the first low voltage VSS1 are applied, the second gate driver 550 generates gate signals (i.e., a gate on signal and a gate off signal) to sequentially apply the gate signal to even-numbered gate lines G2, G4, . . . , and G2$n$.

The display device 100 according to the present exemplary embodiment may have an interlace structure in which the first gate driver 500 applying the gate signal to the odd-numbered gate lines G1, G3, . . . , and G2$n$+1 is provided on the left side of the display device 100 and the second gate driver 550 applying the gate signal to the even-numbered gate lines G2, G4, . . . , and G2$n$ is provided on the right side of the display device 100.

Figure 2:
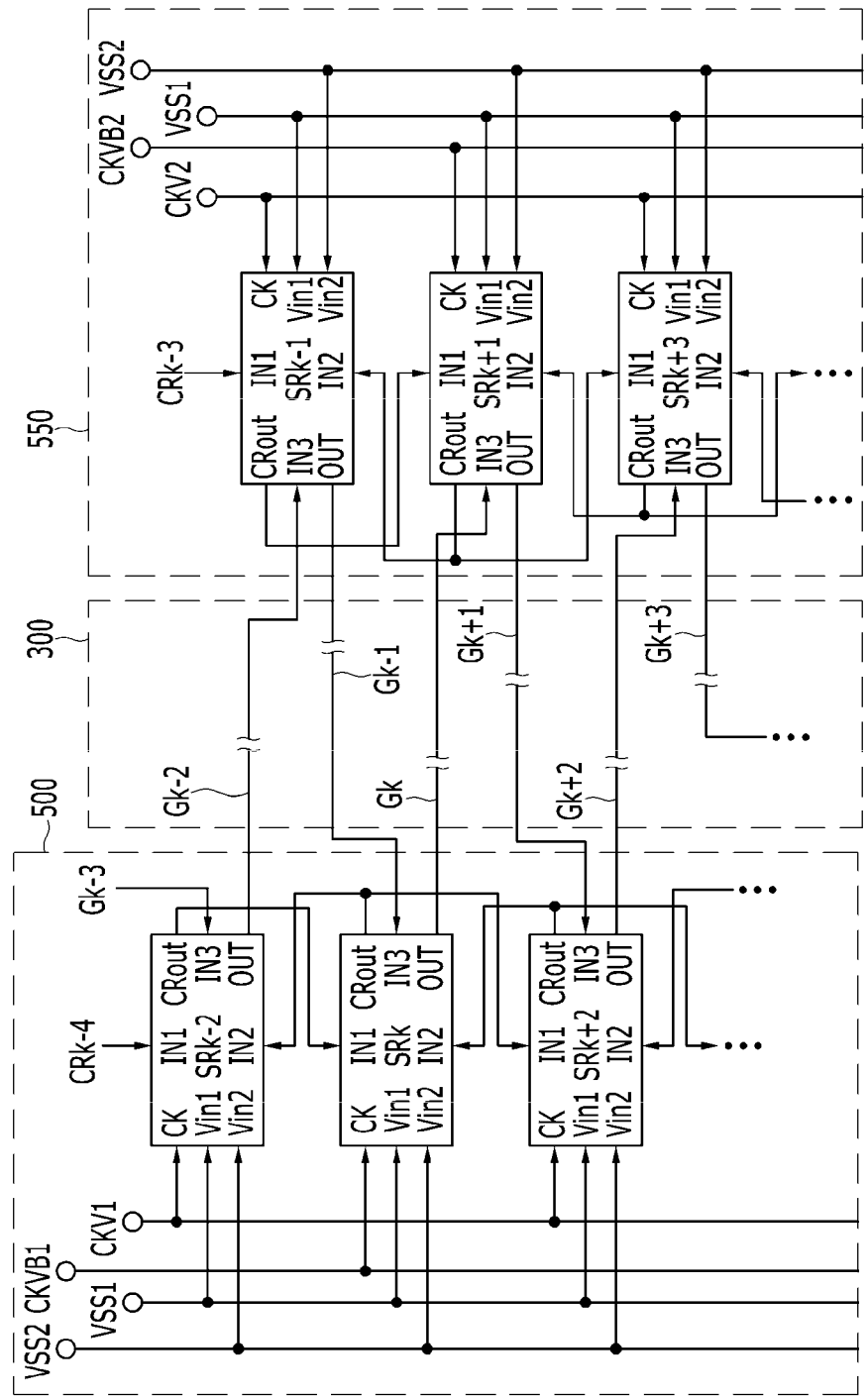
FIG. 2 is a block diagram of a first gate driver and a second driver of the display device according to the exemplary embodiment.

FIG. 2 is a block diagram of the first gate driver and the second gate driver of the display device according to the present exemplary embodiment.

Hereinafter, the first gate driver 500 and the second gate driver 550 will be described with reference to FIG. 2.

Referring to FIG. 2, the first gate driver 500 and the second gate driver 550 respectively include a plurality of stages SRk−2, SRk−1, SRk, SRk+1, SRk+2, SRk+3, . . . . For example, the first gate driver 500 includes stages SRk−2, SRk, SRk+2, . . . , which are odd-numbered stages, corresponding to the odd-numbered gate lines G1, G3, . . . , and G2$n$+1, and the second gate driver 550 includes stages SRk−1, SRk+1, SRk+3, . . . , which are even-numbered stages, corresponding the even-numbered gate lines G2, G4, . . . , and G2$n$.

Each of the stages SRk−2, SRk−1, SRk, SRk+1, SRk+2, SRk+3, . . . , includes three input terminals IN1, IN2, and IN3, one clock terminal CK, two voltage input terminals Vin1 and Vin2, a gate signal output terminal OUT outputting a gate signal to the corresponding gate line, and a carry signal output terminal CRout.

The first input terminal IN1 of the odd-numbered stages SRk−2, SRk, SRk+2, . . . included in the first gate driver 500 are connected with a carry signal output CRout of the previous odd-numbered stage, and thus applied with a carry signal CR of the previous odd-numbered stage. Since the first odd-numbered stage does not have a previous odd-numbered stage, a first scan start signal STVP1 (refer to FIG. 1) is connected to the first input terminal IN1, and thus a first scan start signal is applied thereto.

In addition, the first input terminals IN1 of the even-numbered stages SRk−1, SRk+1, SRk+3, . . . included in the second gate driver 550 are connected to a carry signal output terminal CRout of the previous even-numbered stage and applied with a carry signal CR of the previous even-numbered stage. Since the first even-numbered stage does not have a previous even-numbered stage, a second scan start signal STVP2 (refer to FIG. 2) is connected to the first input terminal IN1 of the first even-numbered stage, and thus a second scan start signal is applied thereto. In this case, timing for when the first scan start signal is applied to the first odd-numbered stage and timing for when the second scan start signal is applied to the first even-numbered stage may be different. For example, the first scan start signal may be applied by a ¼ cycle of the clock signal in advance before the second scan start signal.

A second input terminal IN2 of the k-th stage SRk is connected with a carry signal output terminal CRout of the (k+2)-th stage SRk+2, and thus a carry signal CR of the next terminal stage is applied thereto. For example, a second input terminal IN2 of the odd-numbered stage SRk is connected with a carry signal output terminal CRout of the next odd-numbered stage SRk+2, and thus a carry signal CR of the stage SRk+2 is applied thereto. Likely, a second input terminal IN2 of the even-numbered stage SRk+1 is connected with a carry signal output terminal CRout of the next even-numbered stage SRk+3, and thus a carry signal CR of the stage SRk+3 is applied thereto.

A third input terminal IN3 of the k-th stage SRK is connected with a gate signal output terminal OUT of the (k−1)-th stage (SRk−1), and thus a gate signal output from the (k−1)-th stage (SRk−1) is input thereto through a gate line (Gk−1). For example, a gate signal output from an even-numbered stage (SRk−1) is applied to a third input terminal IN3 of an odd-numbered stage SRk. Likely, a gate signal output from the odd-numbered stage SRk is applied to a third input terminal IN3 of an even-numbered stage (SRk+1).

An odd-numbered stage (SR2n−1; not shown) connected to a (2n−1)-th gate line (G2n−1) and an even-numbered stage (SR2n; not shown) connected to a 2n-th gate line G2n may be formed as dummy stages for application of a gate signal. Unlike other stages SR1 to SRn, the dummy stages (SR2n−1) and SR2n generate dummy gate signals and output the dummy gate signals. However, the dummy stages (SR2n−1) and SR2n may not be connected to gate lines. Although the dummy stages (SR2n−1) and SR2n are connected to the gate lines, they may be connected to gate lines of dummy pixels (not shown) that do not display an image and accordingly they may not be used in displaying an image.

A clock signal may be applied to a clock terminal CK of the k-th stage.

First, a first clock signal [CKV1] and a second clock signal [CKVB1] may be alternately applied to clock terminals CK of the respective odd-numbered stages SRk−2, SRk, SRk+2, . . . . For example, the first clock signal [CKV1] may be applied to clock terminals CK of a first group SRk−2, SRk+2, . . . of the odd-numbered stages, and the second clock signal [CKVB1] may be applied to clock terminals CK of a second group SRk, SRk+4, . . . of the odd-numbered stages.

In addition, a third clock signal [CKV2] and a fourth clock signal [CKVB2] may be alternately applied to a clock terminal CK of each of the even-numbered stages SRk−1, SRk+1, SRk+3, . . . . For example, the third clock signal [CKV2] may be applied to clock terminals CK of a first group SRk−1, SRk+3, . . . of the even-numbered stages, and the fourth clock signal [CKVB2] may be applied to clock terminals CK of a second group SRk+1, SRk+5, . . . of the even-numbered stages.

The first clock signal [CKV1] and the second clock signal [CKVB1] have phase opposite to each other. The third clock signal [CKV2] and the fourth clock signal [CKVB2] have phase opposite to each other. The first clock signal [CKV1] and the third clock signal [CKV2] differ from each other by a ¼ cycle, and the third clock signal [CKV2] and the second clock signal [CKVB1] differ from each other by a ¼ cycle. Regarding turn-on timing of the first to fourth clock signals CKV1 to CKVB2, the third clock signal [CKV2] is turned on after the first clock signal [CKV1] is turned on, the second clock signal [CKVB1] is turned on after the third clock signal [CKV2] is turned on, and the fourth clock signal [CKVB2] is turned on after the second clock signal [CKVB1] is turned on. The first to fourth clock signals may have a high voltage and a first low voltage VSS1.

The first low voltage VSS1 is input to a first voltage input terminal Vin1 of the k-th stage, and a second low voltage VSS2 is input to a second voltage input terminal Vin2 of the k-th stage. The voltage value of the first low voltage VSS1 and the voltage value of the second low voltage VSS2 may vary according to exemplary embodiments. For example, the first low voltage VSS1 may be −7V and the second low voltage VSS2 may be −10V.

Next, operation of the first gate driver 500 and operation of the second gate driver 550 will be described.

First, a transmission signal CR of the previous odd-numbered stage SRk−2 is input to the first input terminal IN1 of the odd-numbered stage SRk. Next, a gate signal G[k−1] of the even-numbered stage SRk−1 is input through the gate signal output terminal OUT of the even-numbered stage SRk−1.

Next, when the first clock signal CKV1 is output from an external source through the clock terminal CK, the odd-numbered stage SRk outputs the gate signal G[k] through the gate signal output terminal OUT. In this case, a carry signal CR is output to the first input terminal IN1 of the next odd-numbered stage SRk+2 through the carry signal output terminal CRout of the odd-numbered stage SRk. The gate signal output to the gate line Gk connected to the odd-numbered stage SRk is transmitted to the third input terminal IN3 of the even-numbered stage SRk+1.

When the transmission signal CR of the next odd-numbered stage SRk+2 is input through the second input terminal IN2, the first low voltage VSS1 is supplied to the first voltage input terminal Vin1 of the odd-numbered stage SRk and the second low voltage VSS2 is supplied to the second voltage input terminal Vin2 of the odd-numbered stage SRk.

The odd-numbered stages SRk−2 and SRk+2 are different from the odd stage SRk in that only the second clock signal CKVB1 is input through the clock terminal CK from an external source.

In the even-numbered stage SRk+1, the transmission signal CR of the previous even-numbered stage SRk−1 is input to the first input terminal IN1. Next, the gate signal G[k] of the odd-stage SRk is input to the third input terminal IN3 through the gate signal output terminal OUT of the odd-numbered stage.

Subsequently, when the fourth clock signal CKVB2 is input through the clock terminal CK from an external source, the even-numbered stage SRk+1 outputs the gate signal G[k+1] through the gate signal output terminal OUT. In this case, the carry signal CR is output to the first input terminal IN1 of the next even-numbered stage SRk+3 through the carry signal output terminal CRout of the even-numbered stage SRk+1. The gate signal G[k+1] output through to the gate line Gk+1 connected to the even-numbered stage SRk+1 is transmitted to the third input terminal IN3 of the odd-numbered stage SRk+2.

When the transmission signal CR of the next even-numbered stage SRk+3 is input through the second input terminal IN2, the first low voltage VSS1 is input to the first voltage input terminal Vin of the even-numbered stage SRk+3 and the second low voltage VSS2 is input to the second voltage input terminal Vin2.

The even-numbered stages SRk−1 and SRk+3 are different from the even-numbered stage SRk+1 in that only the third clock signal CKV2 is input through the clock terminal CK from an external source.

Figure 3:
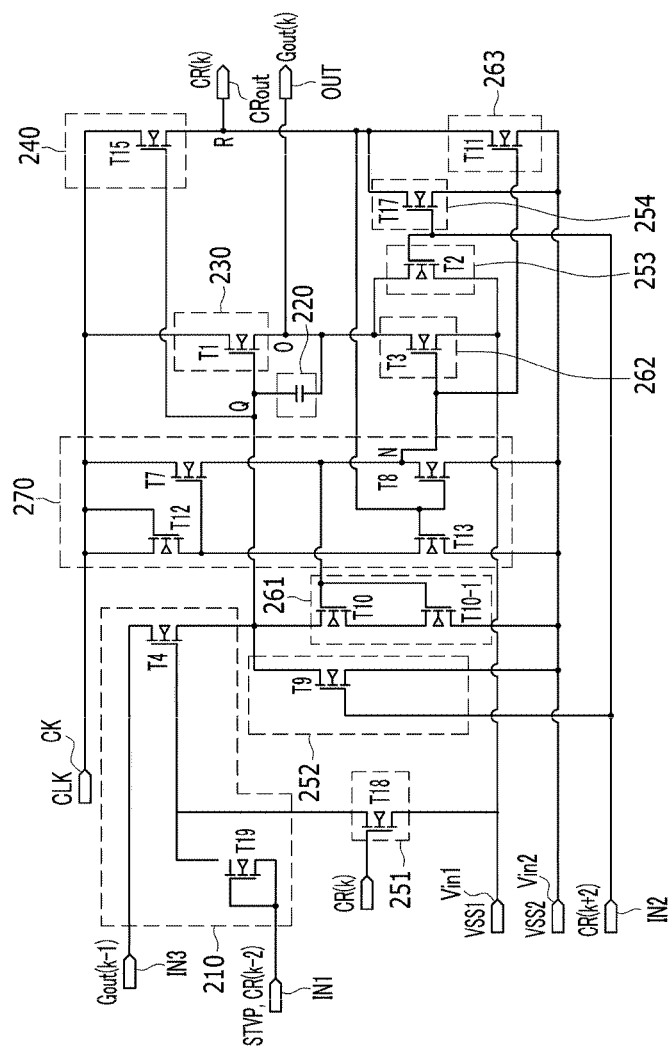
FIG. 3 is a circuit diagram of an enlarged k-th stage among gate drivers according to the exemplary embodiment.

FIG. 3 is an enlarged circuit diagram of the k-th stage in the gate driver according to the exemplary embodiment of the present inventive concept.

Hereinafter, a structure of the k-th stage SRk in the gate driver according to the exemplary embodiment of the present inventive concept will be described in detail.

The k-th stage SRk includes a buffer unit 210, a charger 220, a pull-up unit 230, a carry unit 240, a buffer pull-down unit 251, a first node pull-down unit 252, an output pull-down unit 253, a carry pull-down unit 254, a first node holding unit 261, a second node holding unit 262, a third node holding unit 263, and an inverter 270.

The buffer unit 210 receives a carry signal CR[k−2] of the previous odd-numbered stage SRk−2 and a gate signal Gout[k−1] of the previous even-numbered stage SRk−1 and provides the gate signal Gout[k−1] of the previous even-numbered stage SRk−1 to the pull-up unit 230. The buffer 210 may include a fourth transistor T4 and a nineteenth transistor T19. The fourth transistor T4 includes an input terminal connected to the third input terminal IN3, a control terminal connected to an output terminal of the nineteenth transistor T19, and an output terminal connected to a first node Q. An input terminal and a control terminal of the nineteenth transistor T19 are connected to the first input terminal IN1, and the output terminal of the nineteenth transistor T19 is connected to the control terminal of the fourth transistor T4.

When a carry signal CR[k−2] or a scan start signal of the previous odd-numbered stage SRk−2 is applied as an enable level to the control terminal of the fourth transistor T4 through the diode-connected nineteenth transistor T19, a potential difference occurs between the control terminal and the output terminal of the fourth transistor T4. For example, the potential difference between the control terminal and the output terminal of the fourth transistor T4 corresponds to a difference between the enable level of the carry signal CR[k−2] or scan start signal and a low level Vss2 of the first node Q. Hereinafter, the potential difference between the control terminal and the output terminal of the fourth transistor T4 is referred to as a first voltage V1.

When an output signal Gout[k−1] of the even-numbered stage SRk−1 is applied to the input terminal of the fourth transistor T4 while the potential difference occurs between the control terminal and the output terminal of the fourth transistor T4, the fourth transistor T4 is bootstrapped, and thus the potential difference between the control terminal and the output terminal of the fourth transistor T4 is boosted to a second voltage V2 from the first voltage V1. Accordingly, a current driving capability of the fourth transistor T4 is increased in proportion to the boosted second voltage V2.

The charger 220 pre-charges a first charge voltage V3 in response to the carry signal CR[k−2] of the previous odd-numbered stage SRk−2 supplied from the buffer 210. A first terminal of the charger 220 is connected with the first node Q and a second terminal of the charger 220 is connected to an output node O of the gate signal. The charger 220 pre-charges the first charge voltage V3 that corresponds to a high voltage of the output signal Gout[k−1] of the even-numbered stage SRk−1.

The pull-up unit 230 outputs the gate signal. The pull-up unit 230 may include a first transistor T1. The first transistor T1 includes a control terminal connected to the first node Q, an input terminal connected with the clock terminal CK, and an output terminal connected to the output node O. The output node O is connected with the gate signal output terminal OUT. When a high voltage of the clock signal CKVB1 is transmitted to the clock terminal CK while the first charge voltage V3 is applied to the control terminal of the first transistor T1, the first node Q is boosted to a boosting voltage VBT from the first charge voltage V3. That is, the first node Q is first increased to the first charge voltage V3 and then increased again to the boosting voltage VBT.

While the boosting voltage VBT is applied to the control terminal of the pull-up unit 230, the pull-up unit 230 outputs the high voltage of the clock signal CK as a high voltage of the k-th gate signal G[k]. The k-th gate signal G[k] is output through the gate signal output terminal OUT connected to the output node O.

The carry unit 240 outputs a carry signal CR[k]. The carry unit 240 may include a fifteenth transistor T15. The fifteenth transistor T15 includes a control terminal connected to the first node Q, an input terminal connected to the clock terminal CK, and an output terminal connected to a third node R. The third node R is connected to the carry signal output terminal CRout. The fifteenth transistor T15 may further include a capacitor (not shown) connecting the control terminal and the output terminal. When a high voltage is applied to the first node Q, the carry unit 240 outputs the high voltage of the clock signal CK input to the clock terminal CK as a k-th carry signal CR[k]. The k-th carry signal CR[k] is output through the carry signal output terminal CRout connected to the third node R, and the k-th carry signal CR[k] is transmitted to a control terminal of an eighteenth transistor of the current stage SRk.

The buffer pull-down unit 251 pulls down the carry signal CR[k−2] of the previous odd-numbered stage SRk−2 to the second low voltage VSS1 in response to the carry signal CR[k] of the current stage SRk. The buffer pull-down unit 251 includes the eighteenth transistor T18. The eighteenth transistor T18 may include a control terminal connected to the carry signal output terminal CRout of the current stage SRk, an input terminal connected to the control terminal of the fourth transistor T4, and an output terminal connected to the first low voltage Vss1.

The first node pull-down unit 252 pulls down the high voltage of the first node Q to the second low voltage VSS2. The first node pull-down unit 252 may include a ninth transistor T9. The ninth transistor T9 includes a control terminal connected to the second input terminal IN2, an input terminal connected to the first node Q, and an output terminal connected to the second voltage input terminal Vin2. When a carry signal CR[SRk+2] of the next odd-numbered stage SRk+2 is applied, the first node pull-down unit 252 pulls down the voltage of the first node Q to the second low voltage VSS2 applied to the second voltage input terminal Vin2. Thus, the voltage of the first node Q which is increased to the boosting voltage VBT from the first charge voltage V3, is dropped to the second low voltage VSS2 in response to the carry signal CR[k+2] of the next odd-numbered stage SRk+2.

The output pull-down unit 253 pulls down the gate signal G[k] of the current stage SRk. The output pull-down unit 253 may further include a second transistor T2. The second transistor T2 includes a control terminal connected to the second input terminal IN2, an input terminal connected to the output node O, and the output terminal connected to the first voltage input terminal Vin1. When the carry signal CR[k+2] of the next odd-numbered stage SRk+2 is input to the second input terminal IN2, the output pull-down unit 253 pulls down the voltage of the output node O to the first low voltage VSS1 applied to the first voltage input terminal Vin1.

The carry pull-down unit 254 pulls down the carry signal CR[k] of the current stage SRk. The carry pull-down unit 254 may include a seventeenth transistor T17. The seventeenth transistor T17 includes a control terminal connected to the second input terminal IN2, an input terminal connected to the third node R, and an output terminal connected to the second voltage input terminal Vin2. When the carry signal SR[k+2] of the next odd-numbered stage SRk+2 is applied to the second input terminal IN2, the carry pull-down unit 254 pulls down the voltage of the carry signal CR[k] to the second low voltage VSS2.

The first node holding unit 261 holds the voltage of the first node Q. The first node holding unit 261 may include a tenth transistor T10. The tenth transistor T10 includes a control terminal connected to the second node N, an input terminal connected to the first node Q, and an output terminal connected to the second voltage input terminal Vin2. The first node holding unit 261 holds the voltage of the first node Q with the second low voltage VSS2 in response to a signal of the second node N.

The second node holding unit 262 holds a voltage of the output node Q. The second node holding unit 262 may include a third transistor T3. The third transistor T3 includes a control terminal connected to the second node N, an input electrode connected to the output node O, and an output electrode connected to the first voltage input terminal Vin1. The second node holding unit 262 holds the voltage of the output voltage O with the first low voltage VSS1 applied to the first voltage input terminal Vin1 in response to a signal of the second node N. The voltage of the output node O, pulled down to the first low voltage VSS1 can be more stably held by the second node holding unit 262. The second node holding unit 262 can be omitted as necessary.

The third node holding unit 263 holds a voltage of the third node R. The third node holding unit 263 may include an eleventh transistor T11. The eleventh transistor T11 includes a control terminal connected to the second node N, an input terminal connected to the third node R, and an output terminal connected to the second voltage input terminal Vin2. The third node holding unit 263 holds the voltage of the third node R with the second low voltage VSS2 in response to the signal of the second node N.

The inverter 270 applies a signal, a phase of which is the same as that of the clock signal CK applied to the second node N during a period other than an output period of the carry signal CR[k] of the current stage SRk. The inverter 270 may include a twelfth transistor T12, a seventh transistor T7, a thirteenth transistor T13, and an eighth transistor T8.

The twelfth transistor T12 includes a control terminal diode-connected to the clock terminal CK and an output terminal connected to an input terminal of the thirteenth transistor T13 and a control terminal of the seventh transistor T7. The seventh transistor T7 includes a control terminal connected to the input terminal of the thirteenth transistor T13, an input terminal connected to the clock terminal CK, and an output terminal connected with the input terminal of the eighth transistor T8. The output terminal of the seventh transistor T7 is connected to the second node N. The thirteenth transistor T13 includes a control terminal connected to the third node R, an input terminal connected with the output terminal of the twelfth transistor T12, and an output terminal connected to the second voltage input terminal Vin2. The eighth transistor T8 includes a control terminal connected to the third node R, an input terminal connected to the second node N, and an output terminal connected to the second voltage input terminal Vin2.

While a high voltage is applied to the third node R, the inverter 270 discharges the clock signal [CK] input to the clock terminal CLK with the second low voltage VSS2 applied to the second voltage input terminal Vin2. That is, the eighth transistor T8 and the thirteenth transistor T13 are turned on in response to the high voltage of the third node R, and accordingly, the clock signal [CK] is discharged with the second low voltage VSS2. Thus, the second node N, which is an output node of the inverter 270, is maintained with the second low voltage VSS2 while an n-th gate signal G[n] is output.

Figure 4:
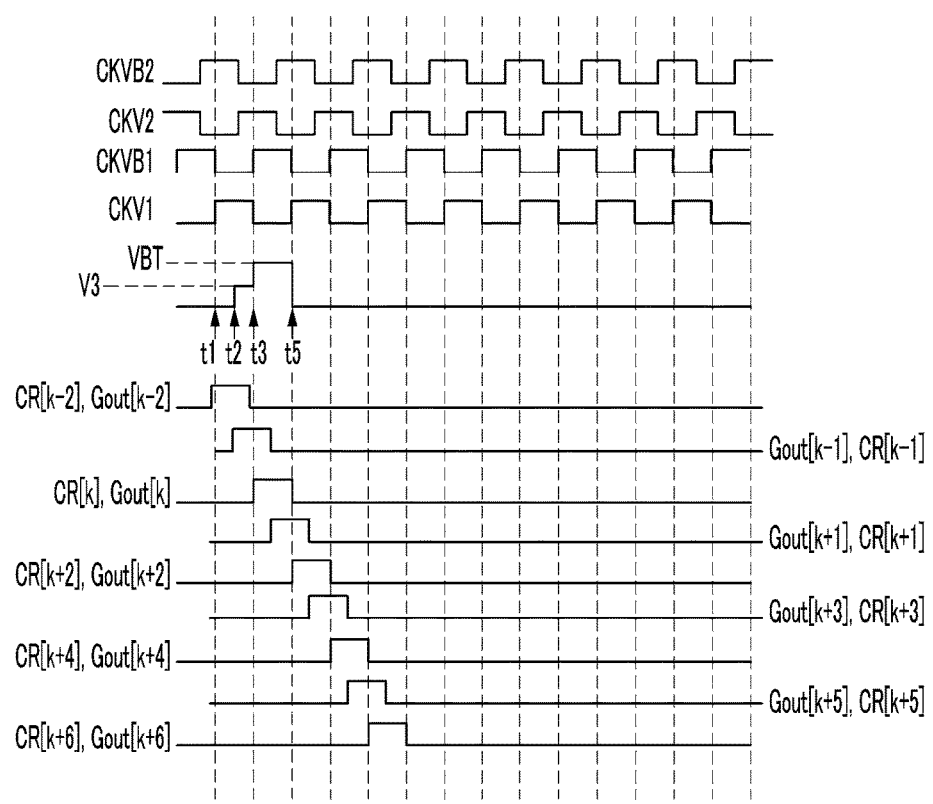
FIG. 4 is a timing diagram illustrating operation of the gate driver according to the exemplary embodiment.

FIG. 4 is a timing diagram of an operation of the gate driver according to the exemplary embodiment of the present inventive concept.

Hereinafter, an operation of the gate driver 500 according to the exemplary embodiment of the present inventive concept will be described with reference to FIG. 4.

At t1, the carry signal CR[k−2] of the previous odd-numbered stage SRk−2 of the scan start signal STVP is applied as an enable level to the control terminal of the fourth transistor T4 through the diode-connected nineteenth transistor T19. Thus, a potential difference that equals as much as the first voltage V1 is generated between the control terminal and the output terminal of the fourth transistor T4.

At t2, when the output signal Gout[k−1] of the even-numbered stage SRk−1 is applied to the input terminal of the fourth transistor T4, the potential difference between the control terminal and the output terminal of the fourth transistor T4 is boosted to the second voltage V2 from the first voltage V1. In addition, the charger 220 performs pre-charging with the first charge voltage V3 that corresponds to the high voltage of the output signal Gout[k−1].

At t3, when the high voltage of the clock signal CKVB1 is input to the clock terminal CK of the first transistor T1, the voltage of the first node Q is bootstrapped in proportion to the boosting voltage VBT due to coupling of the charger 220. While the first node Q is boosted, the pull-up unit 230 outputs the high voltage of the clock signal [CKVB1] as a high voltage of the k-th gate signal G[k]. When the high voltage is applied to the first node Q, the carry unit 240 outputs the high voltage of the clock signal CKVB1 input to the clock terminal CK as a k-th carry signal CR[k]. In addition, the buffer pull-down unit 251 pulls down the carry signal CR[k−2] of the previous odd-numbered stage SRk−2 to the first low voltage VSS1 in response to the carry signal CR[k] of the current stage SRk.

At t5, the first node pull-down unit 252 pulls down the high voltage of the first node Q to the second low voltage VSS2. In addition, the output pull-down unit 253 pulls down the gate signal G[k] of the current stage SRk to the first low voltage VSS1. The carry pull-down unit 254 pulls down the carry signal CR[k] of the current stage SRk to the second low voltage VSS2.

Figure 5:
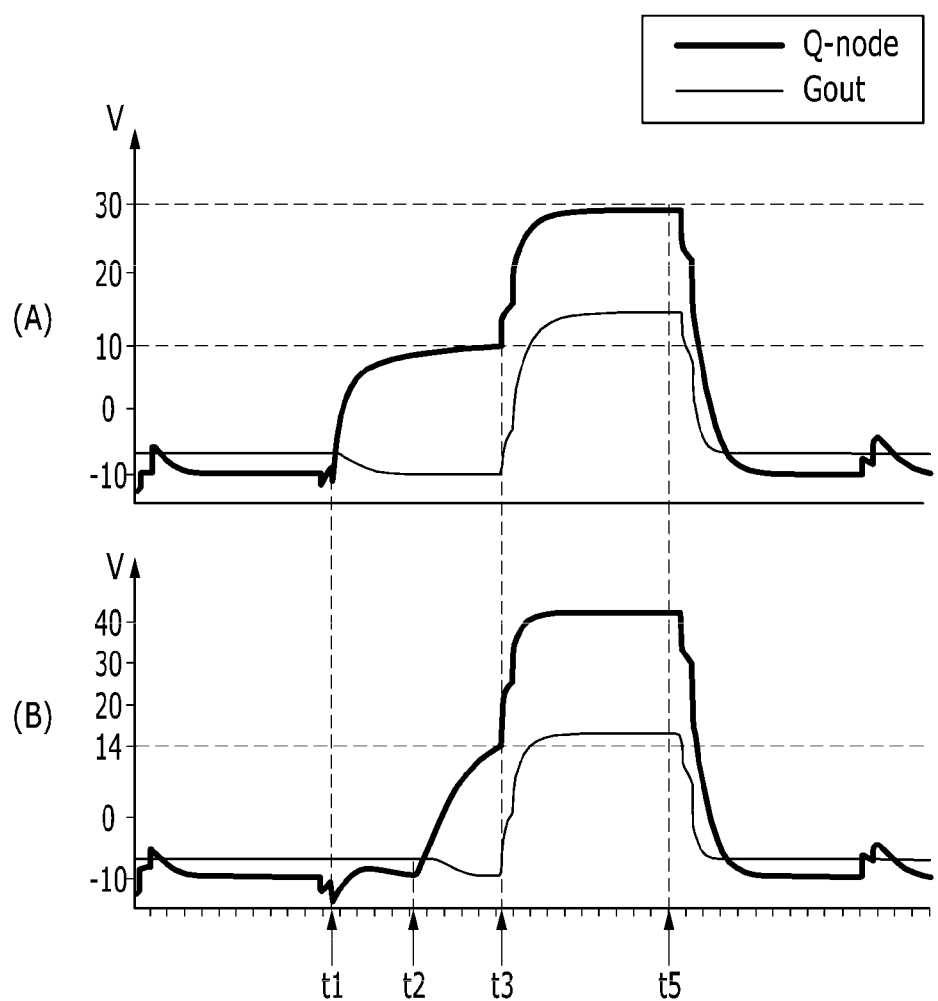
FIG. 5 illustrates an operation characteristic of a conventional gate driver and a gate driver according to the exemplary embodiment of the present inventive concept.

FIG. 5 (A) shows an operation characteristic of a conventional gate driver, and FIG. 5 (B) shows an operation characteristic of the gate driver according to the exemplary embodiment of the present inventive concept.

Hereinafter, the operation characteristic of the gate driver according to the exemplary embodiment of the present inventive concept will be described with reference to FIG. 5.

In FIG. 5, the horizontal axis denotes time and the vertical axis denotes a voltage of the first node Q and a voltage of the output node O (Gout) of the k-th stage.

Referring to FIG. 5 (A), at t1, a transmission signal of a previous stage is changed to a high level and accordingly, the voltage of the first node Q is increased to about 9V and thus pre-charged. At t3, when a clock signal is input, a gate voltage is output to the output terminal of the first transistor T1, and due to bootstrapping, the voltage of the first node Q is further increased to about 30V.

Referring to FIG. 5 (B), at t1, a carry signal CR[k–2] of the previous add-numbered stage SRk–2 is applied, and thus the control terminal of the fourth transistor T4 is applied with an enable level voltage.

At t2, when the output signal Gout[k–1] of the even-numbered stage SRk–1 is applied to the input terminal of the fourth transistor T4, a voltage between the control terminal and the output terminal of the fourth transistor T4 is boosted to the second voltage V2 from the first voltage V1. Thus, current driving capability of the fourth transistor T4 is increased in proportion to the boosted value. In addition, the charger 220 performs pre-charging with about 14V.

At t3, when the clock signal CKVB1 of the clock terminal CK is increased to a high level, the voltage of the first node Q is boosted due to coupling of the charger 220, and thus the voltage of the first node Q is further increased to about 40V.

Thus, a pre-charging margin is increased to about 14V compared to a conventional level of about 9V, and a bootstrapped voltage of the first node Q is increased to about 40V compared to a conventional level of about 30V, thereby enhancing circuit stability. In addition, an increasing time of the output node O can be reduced.

Further, bootstrapping time of the first node Q corresponds to a period from t1 to t3 during which a carry signal CR[k–2] of the previous stage is applied in a conventional case, but in the present exemplary embodiment, bootstrapping time is half of the conventional bootstrapping time and an output signal Gout[k–1] of an even-numbered stage SR[k–1] is applied to the input terminal of the fourth transistor T4, such stress due to a voltage difference between a source and a drain $V_{DS}$ of the fourth transistor T4 is reduced as compared to the conventional case.

Figure 6:
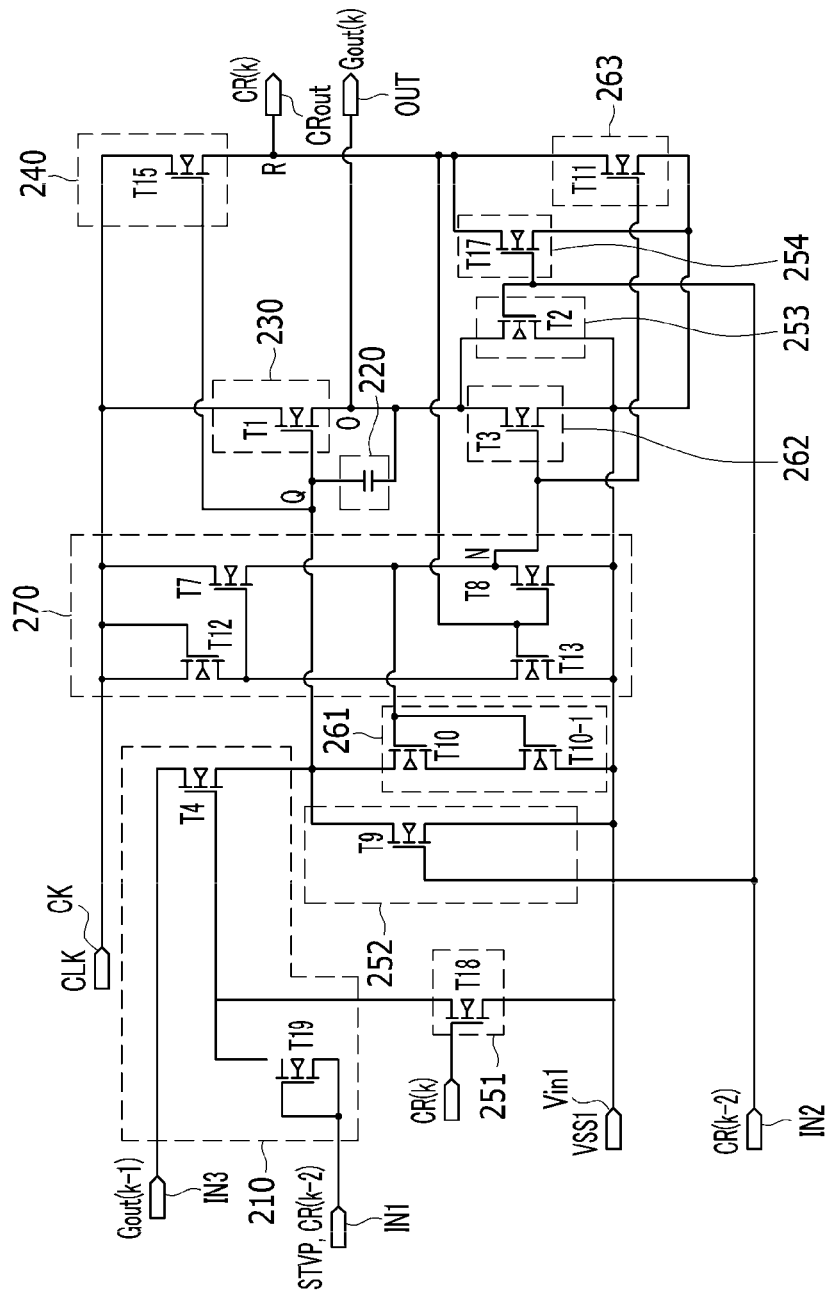
FIG. 6 is an enlarged circuit diagram of a k-th stage in a gate driver according to another exemplary embodiment of the present inventive concept.

FIG. 6 is an enlarged circuit diagram of a k-th stage in a gate driver according to another exemplary embodiment of the present inventive concept.

Hereinafter, a k-th stage according to another exemplary embodiment of the present inventive concept will be described with reference to FIG. 6.

The k-th stage according to the other exemplary embodiment of the present inventive concept is different from the k-th stage according to the above-stated exemplary embodiment of the present inventive concept in that the output terminal of the eighth transistor T8, the ninth transistor T9, the tenth transistor T10, the eleventh transistor T11, the thirteenth transistor T13 and the seventeenth transistor T17 of the above-stated exemplary embodiment is connected to the second voltage input terminal Vin2, but an output terminal of the eighth transistor T8, the ninth transistor T9, the tenth transistor T10, the eleventh transistor T11, the thirteenth transistor T13 and the seventeenth transistor T17 of the present exemplary embodiment is connected to a first voltage input terminal Vin1.

While this inventive concept has been described in connection with what is presently considered to be practical exemplary embodiments, it is to be understood that the inventive concept is not limited to the disclosed embodiments, but, on the contrary, is intended to cover various changes such as additions, modifications, deletions of constituent elements and equivalent arrangements included within the spirit and scope of the appended claims.

What is claimed is:

1. A gate driver comprising a plurality of stages, each receiving a clock signal and outputting a gate signal and a carry signal,
    wherein one of the plurality of stages comprises,
    a first transistor, of which a first terminal and a control terminal are connected to each other and a carry signal of a stage before a previous stage is input to the first terminal and the control terminal, and
    a second transistor, of which a gate signal of the previous stage is input to a first terminal, a control terminal is connected with a second terminal of the first transistor, and an output terminal is connected to a first node,
    the carry signal of the stage before the previous stage is applied to the control terminal of the second transistor through the first transistor, the gate signal of the previous stage is input to the first terminal of the second transistor,
    a voltage difference between the control terminal and an output terminal of the second transistor is boosted during an enable time of the gate signal of the previous stage, and
    a voltage of the first node is boosted at a rising time of the clock signal.

2. The gate driver of claim 1, further comprising:
    a third transistor, a control terminal of which is connected to the first node and an input terminal of which is connected to the clock signal; and
    a capacitor connected to the first node and an output terminal of the third transistor,
    wherein the capacitor is pre-charged corresponding to the gate signal of the previous stage during the enable time of the gate signal of the previous stage and boosted during the rising time of the clock signal.

3. The gate driver of claim 2, further comprising a fourth transistor including a first terminal to which the clock signal is applied and a control terminal connected to the first node,
    wherein the carry signal corresponding to the clock signal applied to the fourth transistor is generated.

4. The gate driver of claim 3, further comprising a fifth transistor including a first terminal connected to the control terminal of the second transistor, a control terminal to which the carry signal is input, and a second terminal to which a low voltage is applied,
    wherein the fifth transistor applies the low voltage to the control terminal of the second transistor according to the carry signal.

5. The gate driver of claim 1, further comprising a fifth transistor including a first terminal connected to the control terminal of the second transistor, a control terminal to which the carry signal is input, and a second terminal to which a low voltage is applied, wherein the fifth transistor applies the low voltage to the control terminal of the second transistor according to the carry signal.

6. A method for driving a gate driver including a plurality of stages, each receiving a clock signal and outputting a gate signal and a carry signal, one of the plurality of stages including a first transistor, of which a first terminal and a control terminal are connected to each other, and a carry signal of a stage before a previous stage is input to the first terminal and the control terminal and a second transistor, of which a gate signal of the previous stage is input to a first terminal, a control terminal is connected with a second terminal of the first transistor, and an output terminal is connected to a first node, comprising:

applying a carry signal of the stage before the previous stage to the control terminal of the second transistor through the first transistor;

inputting the gate signal of the previous stage to the first terminal of the second transistor;

boosting the voltage difference between the control terminal and the output terminal of the second transistor during an enable time of the gate signal of the previous stage; and boosting a voltage of the first node during a rising time of the clock signal.

7. The method for driving the gate driver of claim 6, further comprising a third transistor including a control terminal connected to the first node and an input terminal connected to the clock signal, and a capacitor connected to the control terminal and an output terminal of the third transistor, wherein the capacitor is pre-charged corresponding to the gate signal of the previous stage during the enable time of the gate signal of the previous stage, and the capacitor is boosted during the rising time of the clock signal.

8. The method for driving the gate driver of claim 7, further comprising a fourth transistor including a first terminal to which the clock signal is applied and a control terminal connected to the first node, wherein the carry signal corresponding to the clock signal applied to the fourth transistor is generated.

9. The method for driving the gate driver of claim 8, further comprising a fifth transistor including a first terminal connected to the control terminal of the second transistor, a control terminal to which the carry signal is input, and a second terminal to which a low voltage is applied, wherein the fifth transistor applies the low voltage to the control terminal of the second transistor according to the carry signal.

10. The method for driving the gate driver of claim 6, further comprising a fifth transistor including a first terminal connected to the control terminal of the second transistor, a control terminal to which the carry signal is input, and a second terminal to which a low voltage is applied, wherein the fifth transistor applies the low voltage to the control terminal of the second transistor according to the carry signal.

11. A display device including a display unit including a plurality of pixels connected to corresponding gate lines and a gate driver including a plurality of stages, each receiving a clock signal and outputting a gate signal to the gate line, wherein one of the plurality of stages comprises:

a first transistor of which a first terminal and a control terminal are connected and a carry signal of a stage before a previous stage is input to the first terminal and the control terminal; and a second transistor, of which a gate signal of the previous stage is input to a first terminal, a control terminal is connected with a second terminal of the first transistor, and an output terminal is connected with a first node, the carry signal of the stage before the previous stage is applied to the control terminal of the second transistor through the first transistor, the gate signal of the previous stage is input to the first terminal of the second transistor, a voltage difference between the control terminal and the output terminal of the second transistor is boosted during an enable time of the gate signal of the previous stage, and a voltage of the first node is boosted during a rising time of the clock signal.

12. The display device of claim 11, further comprising a third transistor including a control terminal connected to the first node and an input terminal to which a clock signal is applied and a capacitor connected to the first node and an output terminal of the third transistor, wherein the capacitor is pre-charged corresponding to the gate signal of the previous stage during the enable time of the gate signal of the previous stage and boosted during the rising time of the clock signal.

13. The display device of claim 12, further comprising a fourth transistor including a first terminal to which the clock signal is applied and a control terminal connected to the first node, wherein the carry signal corresponding to the clock signal applied the fourth transistor is generated.

14. The display device of claim 13, further comprising a fifth transistor including a first terminal connected to the control terminal of the second transistor, a control terminal to which the carry signal is input, and a second terminal to which a low voltage is applied, wherein the fifth transistor applies the low voltage to the control terminal of the second transistor according to the carry signal.

15. The display device of claim 11, further comprising a fifth transistor including a first terminal connected to the control terminal of the second transistor, a control terminal to which the carry signal is input, and a second terminal to which a low voltage is applied, wherein the fifth transistor applies the low voltage to the control terminal of the second transistor according to the carry signal.

\* \* \* \* \*